(12) United States Patent  
Lin

(10) Patent No.: US 8,624,482 B2  
(45) Date of Patent: Jan. 7, 2014

(54) DISTRIBUTED BRAGG REFLECTOR FOR REFLECTING LIGHT OF MULTIPLE WAVELENGTHS FROM AN LED

(75) Inventor: Chao-Kun Lin, San Jose, CA (US)

(73) Assignee: Toshiba Techno Center Inc., Tokyo (JP)

( * ) Notice: Subject to any disclaimer, the term of this patent is extended or adjusted under 35 U.S.C. 154(b) by 0 days.

(21) Appl. No.: 13/587,746

(22) Filed: Aug. 16, 2012

(65) Prior Publication Data

US 2013/0058102 A1 Mar. 7, 2013

Related U.S. Application Data

(60) Provisional application No. 61/530,385, filed on Sep. 1, 2011.

(51) Int. Cl.
*H01J 5/16* (2006.01)
*H01J 1/62* (2006.01)
*H01J 63/04* (2006.01)

(52) U.S. Cl.
USPC ........... 313/501; 313/110; 313/113; 313/114; 313/116

(58) Field of Classification Search
None
See application file for complete search history.

(56) References Cited

U.S. PATENT DOCUMENTS

| | | | |
|---|---|---|---|
| 5,306,662 A | 4/1994 | Nakamura et al. |
| 5,408,120 A | 4/1995 | Manabe et al. |
| 5,468,678 A | 11/1995 | Nakamura et al. |
| 5,563,422 A | 10/1996 | Nakamura et al. |
| 5,578,839 A | 11/1996 | Nakamura et al. |
| 5,734,182 A | 3/1998 | Nakamura et al. |
| 5,747,832 A | 5/1998 | Nakamura et al. |
| 5,753,939 A | 5/1998 | Sassa et al. |
| 5,777,350 A | 7/1998 | Nakamura et al. |
| 5,959,307 A | 9/1999 | Nakamura et al. |
| 5,959,401 A | 9/1999 | Asami et al. |
| 6,005,258 A | 12/1999 | Manabe et al. |
| 6,040,588 A | 3/2000 | Koide et al. |
| RE36,747 E | 6/2000 | Manabe et al. |
| 6,215,133 B1 | 4/2001 | Nakamura et al. |

(Continued)

FOREIGN PATENT DOCUMENTS

| | | |
|---|---|---|
| JP | 2626431 | 5/1994 |
| JP | 2681733 | 5/1994 |

(Continued)

OTHER PUBLICATIONS

International Search Report and Written Opinion by the Korean Intellectual Property Office (KIPO) as international searching authority (ISA) in the related international application PCT/US2012/052782 dated Jan. 31, 2013 (16 pages).

*Primary Examiner* — Natalie Walford

(74) *Attorney, Agent, or Firm* — Hogan Lovells US LLP

(57) ABSTRACT

A blue LED device has a transparent substrate and a reflector structure disposed on the backside of the substrate. The reflector structure includes a Distributed Bragg Reflector (DBR) structure having layers configured to reflect yellow light as well as blue light. In one example, the DBR structure includes a first portion where the thicknesses of the layers are larger, and also includes a second portion where the thicknesses of the layers are smaller. In addition to having a reflectance of more than 97.5 percent for light of a wavelength in a 440 nm-470 nm range, the overall reflector structure has a reflectance of more than 90 percent for light of a wavelength in a 500 nm-700 nm range.

14 Claims, 6 Drawing Sheets

(56) References Cited

U.S. PATENT DOCUMENTS

| | | |
|---|---|---|
| 6,265,726 B1 | 7/2001 | Manabe et al. |
| 6,326,236 B1 | 12/2001 | Koide et al. |
| 6,420,733 B2 | 7/2002 | Koide et al. |
| 6,541,293 B2 | 4/2003 | Koide et al. |
| 6,610,995 B2 | 8/2003 | Nakamura et al. |
| 6,657,236 B1 | 12/2003 | Thibeault et al. |
| 6,800,500 B2 | 10/2004 | Coman et al. |
| 6,838,693 B2 | 1/2005 | Kozaki |
| 6,849,881 B1 | 2/2005 | Harle et al. |
| 6,891,197 B2 | 5/2005 | Bhat et al. |
| 6,906,352 B2 | 6/2005 | Edmond et al. |
| 6,916,676 B2 | 7/2005 | Sano et al. |
| 6,951,695 B2 | 10/2005 | Xu et al. |
| 6,977,395 B2 | 12/2005 | Yamada et al. |
| 7,026,653 B2 | 4/2006 | Sun |
| 7,106,090 B2 | 9/2006 | Harle et al. |
| 7,115,908 B2 | 10/2006 | Watanabe et al. |
| 7,138,286 B2 | 11/2006 | Manabe et al. |
| 7,193,246 B1 | 3/2007 | Tanizawa et al. |
| 7,262,436 B2 | 8/2007 | Kondoh et al. |
| 7,312,474 B2 | 12/2007 | Emerson et al. |
| 7,335,920 B2 | 2/2008 | Denbaars et al. |
| 7,345,297 B2 | 3/2008 | Yamazoe et al. |
| 7,348,602 B2 | 3/2008 | Tanizawa |
| 7,402,838 B2 | 7/2008 | Tanizawa et al. |
| 7,442,966 B2 | 10/2008 | Bader et al. |
| 7,446,345 B2 | 11/2008 | Emerson et al. |
| 7,491,565 B2 | 2/2009 | Coman et al. |
| 7,547,908 B2 | 6/2009 | Grillot et al. |
| 7,611,917 B2 | 11/2009 | Emerson et al. |
| 7,709,851 B2 | 5/2010 | Bader et al. |
| 7,737,459 B2 | 6/2010 | Edmond et al. |
| 7,754,514 B2 | 7/2010 | Yajima et al. |
| 7,791,061 B2 | 9/2010 | Edmond et al. |
| 7,791,101 B2 | 9/2010 | Bergmann et al. |
| 7,795,623 B2 | 9/2010 | Emerson et al. |
| 7,897,992 B2 | 3/2011 | Shum et al. .............. 257/99 |
| 7,910,945 B2 | 3/2011 | Donofrio et al. |
| 7,939,844 B2 | 5/2011 | Hahn et al. |
| 7,947,994 B2 | 5/2011 | Tanizawa et al. |
| 8,003,998 B2 * | 8/2011 | Bogner et al. .............. 257/98 |
| 8,021,904 B2 | 9/2011 | Chitnis |
| 8,030,665 B2 | 10/2011 | Nagahama et al. |
| 8,149,500 B2 * | 4/2012 | Godshalk et al. .............. 359/305 |
| 2005/0040410 A1 * | 2/2005 | Ledentsov et al. .............. 257/79 |
| 2010/0123948 A1 | 5/2010 | Godshalk et al. .............. 359/305 |
| 2011/0114969 A1 | 5/2011 | Lee et al. .............. 257/88 |

FOREIGN PATENT DOCUMENTS

| | | |
|---|---|---|
| JP | 2917742 | 6/1994 |
| JP | 2827794 | 8/1994 |
| JP | 2778405 | 9/1994 |
| JP | 2803741 | 9/1994 |
| JP | 2785254 | 1/1995 |
| JP | 2735057 | 3/1996 |
| JP | 2956489 | 3/1996 |
| JP | 2666237 | 12/1996 |
| JP | 2890396 | 12/1996 |
| JP | 3250438 | 12/1996 |
| JP | 3135041 | 6/1997 |
| JP | 3209096 | 12/1997 |
| JP | 3506874 | 1/1998 |
| JP | 3654738 | 2/1998 |
| JP | 3795624 | 2/1998 |
| JP | 3304787 | 5/1998 |
| JP | 3344257 | 8/1998 |
| JP | 3223832 | 9/1998 |
| JP | 3374737 | 12/1998 |
| JP | 3314666 | 3/1999 |
| JP | 4118370 | 7/1999 |
| JP | 4118371 | 7/1999 |
| JP | 3548442 | 8/1999 |
| JP | 3622562 | 11/1999 |
| JP | 3424629 | 8/2000 |
| JP | 4860024 | 8/2000 |
| JP | 3063756 | 9/2000 |
| JP | 4629178 | 9/2000 |
| JP | 3063757 | 10/2000 |
| JP | 3511970 | 10/2000 |
| JP | 3551101 | 5/2001 |
| JP | 3427265 | 6/2001 |
| JP | 3646649 | 10/2001 |
| JP | 3780887 | 5/2002 |
| JP | 3890930 | 5/2002 |
| JP | 3786114 | 4/2004 |
| JP | 4904261 | 6/2004 |
| KR | 10-0993112 | 11/2010 |
| WO | WO 2005/055382 | 6/2005 |

* cited by examiner

FOR A DESIGN WAVELENGTH λ = 510 NANOMETERS

| | MATERIAL | THICKNESS (Å) (10Å = 1nm) | QWOT $\frac{\lambda}{4\eta}$ | INDEX OF REFRACTION ($\eta$) | |
|---|---|---|---|---|---|
| (5) | SAPPHIRE | | | MID | |
| (8) | SiO2 | 4101 | 5 | LOW | $R_{1\pi}$ |
| (9) | TiO2 | 447 | 1 | HIGH | $R_2$ |
| | SiO2 | 820 | 1 | LOW | $R_{3\pi}$ |
| | TiO2 | 447 | 1 | HIGH | $R_4$ |
| | SiO2 | 820 | 1 | LOW | $R_{5\pi}$ |
| | TiO2 | 447 | 1 | HIGH | $R_6$ |
| | SiO2 | 820 | 1 | LOW | $R_{7\pi}$ |
| (10) | ALUMINUM | 3000 | | | |

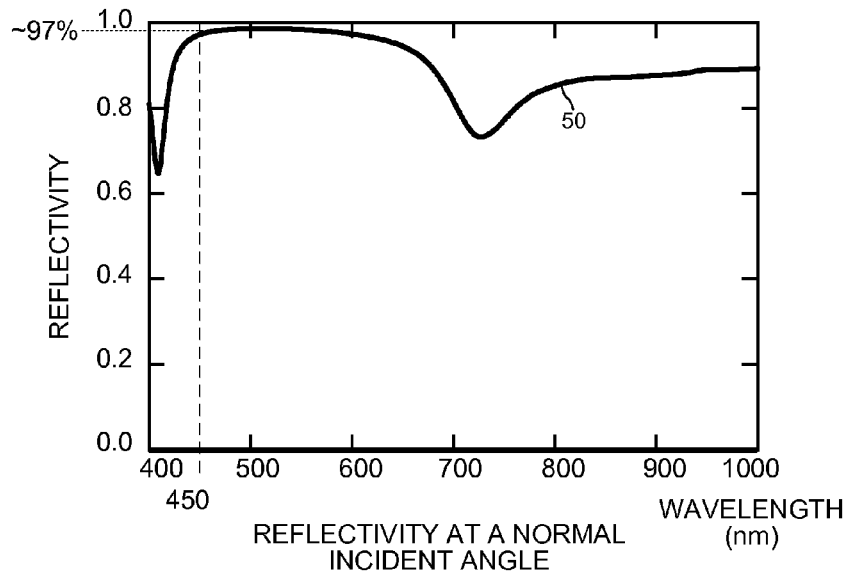
(PRIOR ART)
FIG. 3
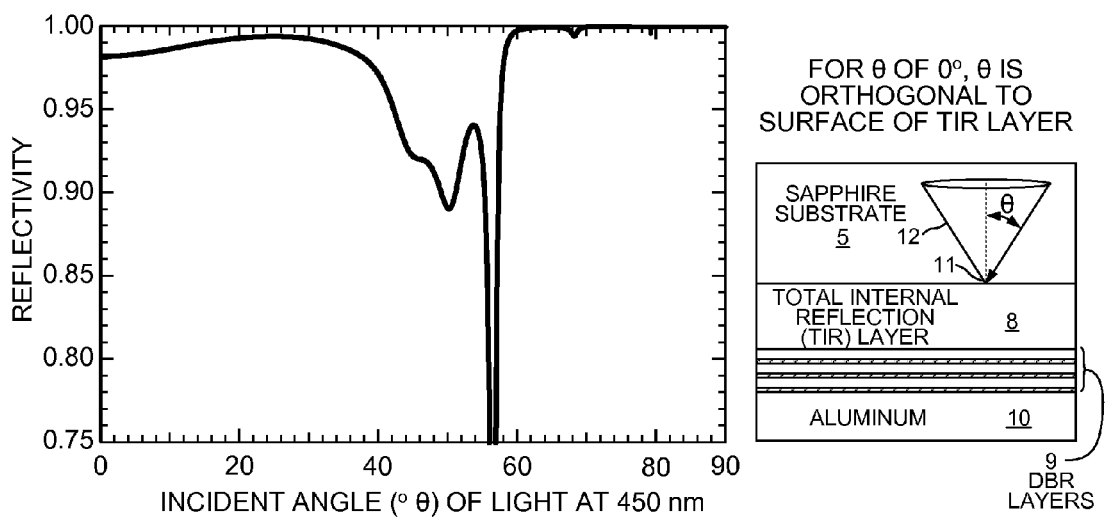
(PRIOR ART)
FIG. 4A
(PRIOR ART)
FIG. 4B

FOR A DESIGN WAVELENGTH λ = 480 NANOMETERS

| MATERIAL | THICKNESS (Å) (10Å = 1nm) | QWOT | INDEX OF REFRACTION | |
|---|---|---|---|---|
| SAPPHIRE | | | | |
| SiO2 | 3933 | 5 | 1.45 | LOW |
| TiO2 | 754.2 | 1.7588 | 2.66 | HIGH |
| SiO2 | 1384 | 1.7588 | 1.45 | LOW |
| TiO2 | 754.2 | 1.7588 | 2.66 | HIGH |
| SiO2 | 1384 | 1.7588 | 1.45 | LOW |
| TiO2 | 464.8 | 1.084 | 2.66 | HIGH |
| SiO2 | 852.7 | 1.084 | 1.45 | LOW |
| TiO2 | 464.8 | 1.084 | 2.66 | HIGH |
| SiO2 | 852.7 | 1.084 | 1.45 | LOW |
| TiO2 | 464.8 | 1.084 | 2.66 | HIGH |
| SiO2 | 852.7 | 1.084 | 1.45 | LOW |
| ALUMINUM | 3000 | | | |

REFLECTIVITY AT A NORMAL INCIDENT ANGLE

DISTRIBUTED BRAGG REFLECTOR FOR REFLECTING LIGHT OF MULTIPLE WAVELENGTHS FROM AN LED

CROSS REFERENCE TO RELATED APPLICATIONS

This application claims priority under 35 U.S.C. §119 from U.S. Provisional Application No. 61/530,385, entitled "Distributed Bragg Reflector for Reflecting Light of Multiple Wavelengths from an LED," filed on Sep. 1, 2011, the subject matter of which is incorporated herein by reference.

TECHNICAL FIELD

The present invention relates generally to light-emitting diodes (LEDs), and more particularly, to a blue LED having a reflector structure that reflects blue and yellow light well.

BACKGROUND INFORMATION

FIG. 1 (prior art) is a simplified cross-sectional diagram of one type of so-called white LED assembly 1. Assembly 1 includes a lateral blue LED device 2. The active layer 3 of the blue LED device 2 emits light in all directions, and the light bounces randomly within the LED device. A substantial amount (about 50%) of light travels downward. If the light 4 traveling downwards is not reflected back upward so that it can then escape from the top surface of LED device, but rather if the light traveling downwards is absorbed by the die-attach adhesive or by the aluminum core PCB, then the light generation efficiency of the overall white LED assembly will suffer.

The structure of the lateral LED device entails a sapphire substrate 5 that is substantially transparent to the blue light. Accordingly, a reflector structure 6 is disposed on the backside (i.e., bottom side in the diagram) of the transparent substrate 5 to reflect light that was traveling in a downward direction. Reflector structure 6 reflects the light that travels downwards, passes this light back up and through the transparent substrate and through the epitaxial layers of the LED device. The reflected light then escapes the LED device and reaches phosphor 7 embedded in encapsulant, such as silicone. The phosphor absorbs some of the blue light and fluoresces, thereby re-emitting light of longer wavelengths including green, yellow and red light. The overall spectrum of light emitted from the overall LED assembly 1 is therefore said to be white light. This white light is the useful light produced by the assembly.

The reflector structure 6 can be a single layer of a highly reflective metal such as, for example, silver. Unfortunately, silver has attendant contamination and electromigration issues. For this and other reasons, LED devices such as the LED device 2 of FIG. 1 may have reflector structures involving a total internal reflection (TIR) layer 8, a Distributed Bragg Reflector (DBR) structure 9, and an underlying layer 10 of reflective metal. The combination of these layers is superior in terms of reflectivity to a single mirror layer of a highly reflective metal.

According to Snell's law, all of the light traveling from a material having a higher index of refraction toward a material having a lower index of refraction at an angle greater than the critical angle will be reflected back into the higher-index-of-refraction material without experiencing any energy loss. This mechanism is known as total internal reflection (TIR). The TIR layer 8 is fashioned to reflect blue light that is passing toward the reflector at angles greater than the critical angle. The lower two portions 9 and 10 of the reflector structure (the DBR and the reflective metal layer) are provided to reflect any remaining light that passes through the TIR layer.

In its simplest form, a DBR is a quarter wave stack of dielectric materials. The quarter wave stack consists of a stack of layers, where the material from which the layers are made alternates from layer to layer down the stack. The materials are selected such that the alternating layers have a high index of refraction, and then a low index of refraction, and then a high index of refraction, and so forth down the stack. For a given wavelength of light entering the stack from the top, the upper layer is made to have a thickness of one quarter of the wavelength, where this wavelength is the wavelength of the light when the light is passing through the layer. The wavelength $\lambda$, frequency f, and velocity v of light is given by the equation $\lambda=v/f$. When light leaves one medium and enters another medium, the speed and wavelength of the light may change but the frequency does not change. The material from which the upper layer is made therefore determines the speed of light v in the medium. The material therefore also influences the wavelength $\lambda$ of the light in the upper layer.

Each material has an index of refraction $\eta$. The index of refraction $\eta$ is the ratio of the speed of light in a vacuum to the speed of light in the medium. The wavelength of light in a medium is given by the equation $\lambda=\lambda o/\eta$, where $\lambda o$ is the wavelength in a vacuum. Light traveling through air is traveling at close to the speed of light in a vacuum, so the wavelength of light in air is close to wavelength of the light in a vacuum. The design wavelength $\lambda o$ for the DBR is usually longer than the LED emitting wavelength when the reflectivity of the DBR for the light with incident angles between zero degrees and the critical angle is considered. For example, the optimal DBR design wavelength for a 450 nm LED is around 510 nm. The relationship QWOT=$\lambda o/4\eta$ is used to determine the quarter wavelength in the medium of a layer, where $\eta$ is the refractive index of the material from which the layer is made. In this way, the refractive indices of the materials of the various layers of the stack are used to determine how thick each layer of the stack should be so that it is one quarter wavelength in thickness.

Light passes into the stack and through the upper layer, and then some of the light reflects off the interface between the upper layer and the next layer down in the stack. Part of the light proceeds down into the next layer of the stack to the next interface. If the interface is one from a low-index medium to a high-index medium, then any light reflected from the interface will have a phase shift of 180 degrees. If, on the other hand, the interface is one from a high-index medium to a low-index medium, then any reflected light will have no phase shift. Each interface causes a partial reflection of the light wave passing into the stack. The phase shifts, in combination with the thicknesses of the layers of the stack, are such that the portions of light reflecting off interfaces all return to the upper surface of the stack in phase with each other. The many reflections off the many interfaces all combine at the top of the stack with constructive interference. The result is that the Distributed Bragg Reflector has a high reflectivity within a finite spectral range known as the stop-band. Then lastly at the bottom of the reflector structure 6 is the layer 10 of reflective metal.

FIG. 2 (prior art) is a table that sets forth the thicknesses and materials of the various layers of the Distributed Bragg Reflector of the prior art LED device 2 of FIG. 1 based on a design wavelength of 510 nm. The n notation above the line between two rows indicates that the light reflected by the interface between the materials of the two rows is phase shifted by 180 degrees. The upper $SiO_2$ layer has a thickness of 4101 angstroms and is the TIR layer 8. The DBR structure 9 includes three periods, where each period has a first layer of $TiO_2$ that is 447 angstroms thick and a second layer of $SiO_2$ that is 820 angstroms thick.

FIG. 3 is a diagram that shows the normal-incident reflectivity spectrum with the reflector design described in FIG. 2. The stop-band of the spectrum centers around 510 nm, and the short wavelength side of the stop-band is aligned to 450 nm. According to theoretical calculation, the reflectivity spectrum blue-shifts toward the short wavelength when the light incident angle increases from surface normal toward grazing angle to the reflector. The reflector was optimized to ensure high reflectivity for the light with wavelength of 450 nm over a broad range of incident angles. FIG. 4A is a diagram that charts the reflectivity of the reflector structure 6 versus the angle of incidence of light with a wavelength of 450 nm reaching a point 11 on the reflector. The light with incident angles between 0 and 58 degree are reflected by the DBR and the metal reflector, while the light with incident angle greater than 58 degree is reflected by the TIR layer. To evaluate the total reflectivity of the reflector with all incident angles, a normalized angular reflectance is defined. Referring to FIG. 4B, light is assumed to be transmitted toward point 11 on the reflector from all directions with a uniform angular distribution. The amount of light incident on the point that is reaching the point 11 with an incident angle θ is considered. Many different light rays may actually reach the point from this incident angle, where the light rays can be thought of as passing to the point in a cone shape. The upper lip of the cone 12 illustrated in FIG. 4B represents a circle of origination points for such rays for the incident angle θ.

Accordingly, there is more light incident on point 11 for an incident angle of one degree than for an incident angle of zero degrees. This larger amount of light at larger angles is considered, and the corresponding total amount of reflected light is determined for angles zero (orthogonal) through 90 degrees (a grazing angle). The normalized angular reflectance is then calculated by integrating the angular reflectivity (FIG. 4A) with a sine dependence of incident angle and normalized to a perfect angular reflectivity spectrum. This analysis is performed for light of a given wavelength, for example 450 nm, to compare the performance of the reflector for blue light emitted by the LED in the white LED assembly FIG. 1. When analyzed this way, the prior art reflector structure of the LED device of FIG. 1 has a reflectivity of approximately 97 percent for incident blue light (having a wavelength of 450 nm). Accordingly, most all of the blue light 4 traveling downward is then reflected back up the reflector so that it can escape the LED device. The reflector structure involving DBR 9 is more effective than a simple mirror layer of a reflective metal such as silver.

SUMMARY

A blue LED device has an active layer involving indium, gallium and nitrogen. The active layer is configured to emit blue light that is quasi-monochromatic and non-coherent. The blue LED also has a transparent substrate (substantially transparent to visible light) and a reflector structure disposed on the backside of the substrate. The reflector structure includes a Distributed Bragg Reflector (DBR) structure having layers configured to reflect green, yellow and red light as well as blue light. In one example, the DBR structure includes a first portion where the thicknesses of the layers are relatively larger, and also includes a second portion where the thicknesses of the layers are relatively smaller. In addition to having a normalized angular reflectance of more than 97.5 percent for light of a wavelength in a first range between 440 nm-470 nm, the overall reflector structure also has a normalized angular reflectance of more than 95 percent for light of a wavelength in a second range between 500 nm-700 nm. The reflector structure reflects light passing from the transparent substrate and to the reflector structure such that the overall LED device has a Photon Recycling Efficiency (PRE) of more than 85 percent for light having a wavelength ranging from 500 nm to 700 nm.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 3 (prior art) is a diagram that charts reflectivity versus the wavelength of incident light at a normal incident angle for the reflector structure of the prior art LED device of FIG. 1.

FIG. 4A (prior art) is a diagram that charts the reflectivity of the reflector structure of the prior art LED device of FIG. 1 versus the angle of incidence of light of a wavelength of 450 nm reaching a point on the reflector.

FIG. 4B (prior art) is a conceptual diagram that illustrates a consideration involved in determining the normalized angular reflectance.

DETAILED DESCRIPTION

Reference will now be made in detail to some embodiments of the invention, examples of which are illustrated in the accompanying drawings.

Figure 5:
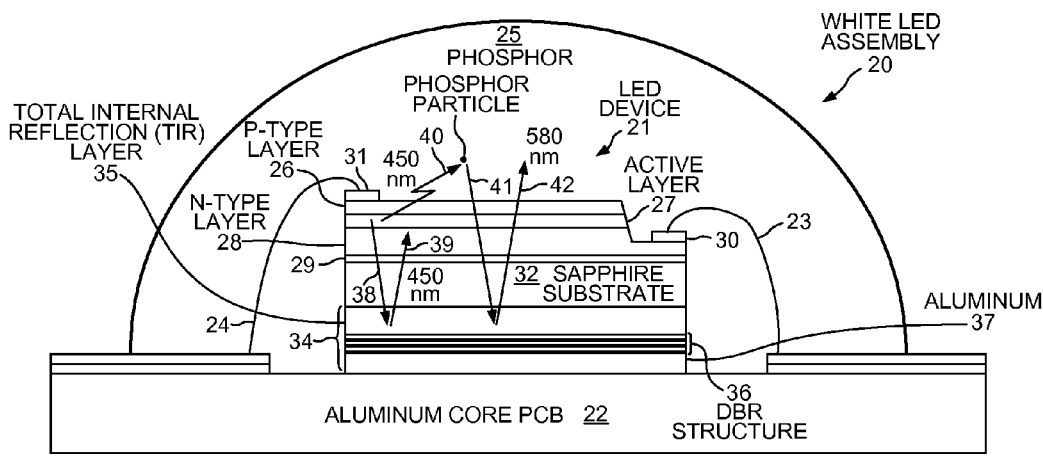
FIG. 5 is a diagram of a white LED assembly in accordance with one novel aspect.

FIG. 5 is a simplified cross-sectional diagram of a white LED assembly 20 in accordance with one novel aspect. White LED assembly 20 includes a blue LED device 21, an aluminum core PCB 22, a pair of wire bonds 23 and 24, and an amount of phosphor 25. Particles of phosphor are suspended in a dome structure of silicone as illustrated. LED device 21 includes an epitaxial layer portion that includes, among other parts not illustrated, a p-type layer 26, an active layer 27, an n-type layer 28, a buffer layer 29, and two metal electrodes 30 and 31. The layers 26-28 are made of gallium nitride materials and the active layer includes indium such that the active layer emits so-called blue light as is known in the GaN blue LED art. The light is quasi-monochromatic and non-coherent. In the present example, the wavelength of the light emitted by the active layer 27 has a relatively narrow bandwidth and is centered at approximately 450 nm.

Figure 6:
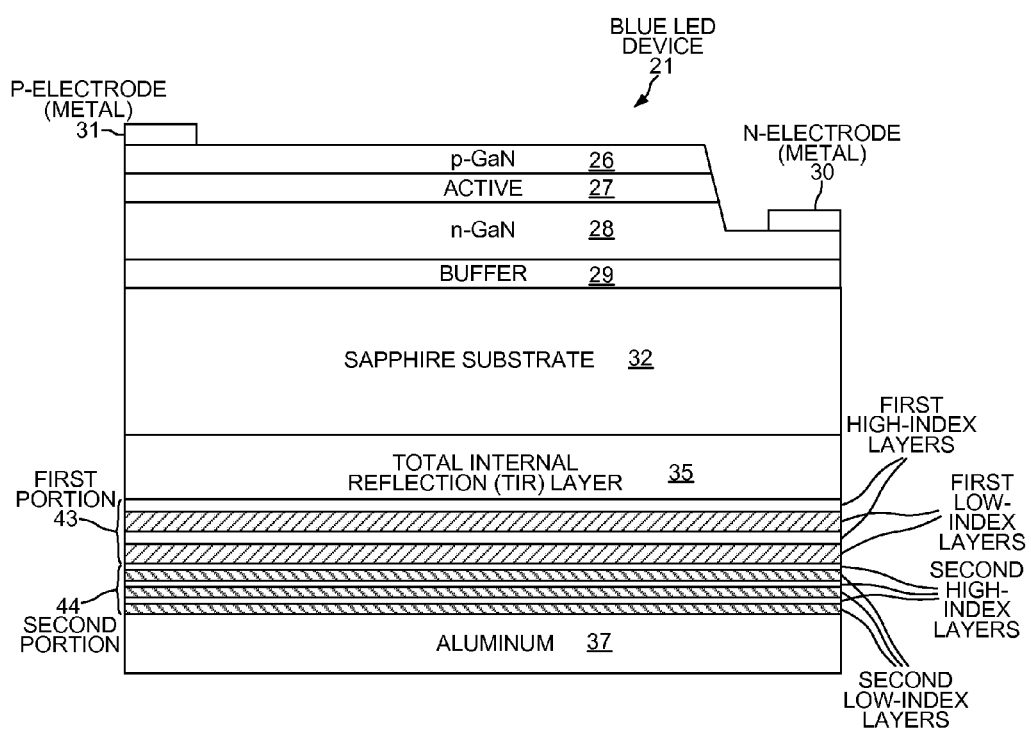
FIG. 6 is a simplified cross-sectional diagram of a blue LED device within the white LED assembly of FIG. 5.

The epitaxial layers are disposed on a transparent substrate 32. Transparent substrate 32 is made of a transparent material, such as sapphire, SiC, GaN or AlN. In the present example, the transparent substrate 32 is a sapphire substrate. Below substrate 32 is a novel reflector structure 34. Reflector structure 34 includes a total internal reflection (TIR) layer 35, a multi-layer Distributed Bragg Reflector (DBR) structure 36, and a reflective metal layer 37. TIR layer 35 and the low refractive index layers of DBR 36 can be made of low index dielectric material, such as SiO2, MgF2 or CaF2, and the high index layers of DBR 36 can be made of high index dielectric material, such TiO2, ZnSe, Si3N4, Nb2O5 or Ta2O5. Reflective metal layer 37 can be made of any reflective metal, such as aluminum, silver, rhodium, platinum or nickel. Reflector structure 34 is disposed on the "backside" of the substrate on the opposite side of the substrate from the epitaxial layers. FIG. 6 is a more detailed cross-sectional diagram of the blue LED device 21 of the white LED assembly 20 of FIG. 5.

As is conventionally recognized, half of the light emitted from the active layer of an LED travels downward. This light, which in the present example has a wavelength of approximately 450 nm, should be reflected back upward by the reflector structure as described above in the background section. This light is represented in FIG. 5 by rays 38 and 39.

Figures 1, 2:
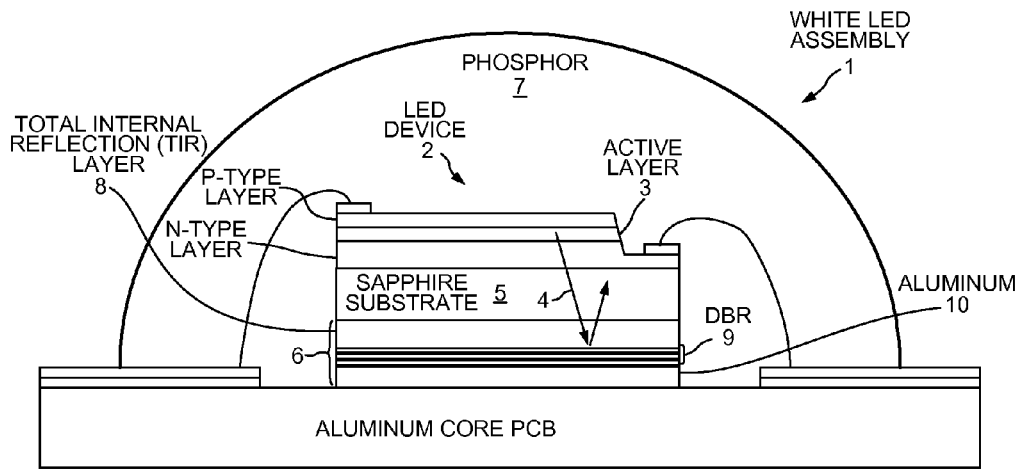
FIG. 1 (prior art) is a simplified cross-sectional diagram of a conventional so-called white LED.
FIG. 2 (prior art) is a table that sets forth the thicknesses and constituent materials of the various layer of the Distributed Bragg Reflector of the prior art LED device of FIG. 1.

In accordance with one novel aspect, it is now recognized that some of the light 40 traveling upwards escapes the LED device and reaches the phosphor 25 but is then down-converted by the phosphor into light of longer wavelengths. Some of this converted light 41 then travels back towards the LED device in such a way that it passes into the LED device. The light that is emitted back at the LED device by the phosphor is generally in the range of from 500 nm to 700 nm and is referred to here for simplicity purposes as "yellow" light. This light is represented in FIG. 5 by rays 41-42. Whereas in the prior art reflector structure described above in connection with FIGS. 1-4 the reflector structure was not optimized to reflect light of this yellow wavelength, the novel reflector structure 34 of FIG. 5 is designed to improve the reflectivity of light of this wavelength. The novel reflector structure 34 is not optimized for reflecting only blue light, and is not optimized for reflecting only yellow light, but rather the layers of the novel reflector structure are configured to reflect both blue and yellow light with high reflectivity. Thus, the novel reflector structure 34 has a DBR that is substantially optimized for reflecting both blue light of approximately 450 nm and yellow light of approximately 580 nm. In one example, the reflector structure 34 has a normalized angular reflectance of more than 95.5 percent for first light having a wavelength in a range from 500 nm to 700 nm (referred to here as yellow light), and also has a normalized angular reflectance of more than 97.5 percent second light having a wavelength in a range from 440 nm to 470 nm (referred to here as blue light). The photon efficacy (lumens per watt) of the overall novel LED assembly 20 of FIG. 5 is improved as compared to the photon efficacy of the overall conventional LED assembly 1 of FIG. 1 largely due to the improved reflectivity of the reflector structure 34 in reflecting the light in the 500 nm to 700 nm range.

Designing the DBR structure 34 is not as simple as designing a first DBR optimized for reflecting yellow light, and designing a second DBR optimized for reflecting blue light, and then combining the two DBRs into a single composite DBR structure. Light passing through the DBR structure from one portion to the next is affected in complex ways that complicates the determination of the thicknesses of the various layers, and the DBR is not entirely optimized for either yellow or blue light, but in a simplistic explanation a first portion 43 of the DBR 34 functions primarily to reflect yellow light, whereas a second portion 44 of the DBR 34 functions primarily to reflect blue light. The thicknesses of the layers of the first portion 43 are larger, whereas the thicknesses of the layers of the second portion 44 are smaller.

Figures 7, 8:
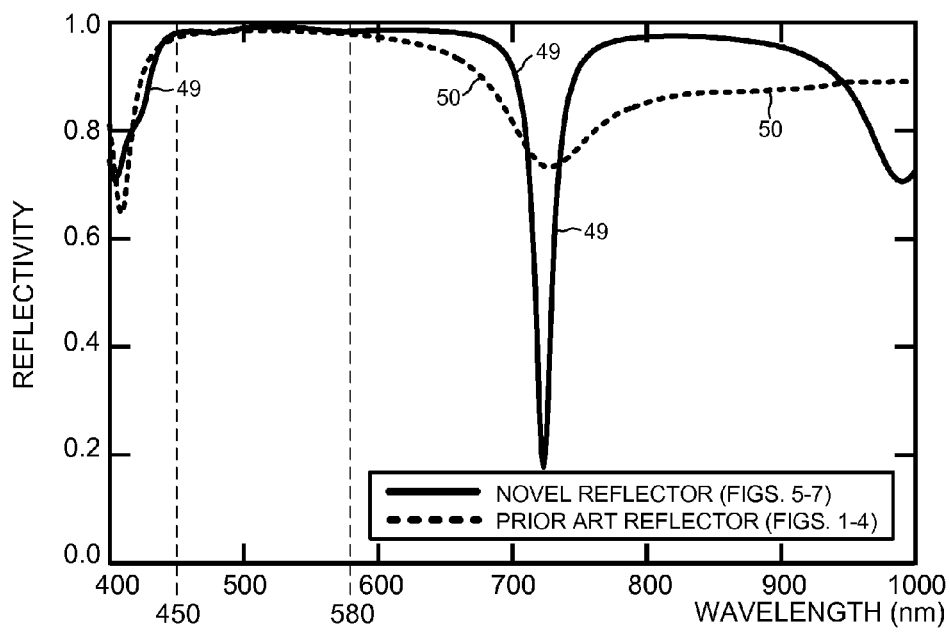
FIG. 7 is a table that sets forth the thicknesses and constituent materials of the various layers of the novel reflector structure of FIGS. 5-6.
FIG. 8 is a diagram that charts reflectivity versus wavelength of incident light normal to the reflector surface for the novel reflector structure of FIGS. 5-7.

FIG. 7 is a table that sets forth the thicknesses and compositions of the various layers of the reflector structure 34 in one specific embodiment. Row 45 corresponds to the TIR layer 35. Rows 46 correspond to the first portion 43 of the DBR structure 36, and rows 47 correspond to the second portion 44 of the DBR structure 36. Row 48 corresponds to the layer 37 of reflective metal. The values in the table are for a design wavelength of 480 nm. Accordingly, the quarter-wave optical thickness (QWOT) values close to one in rows 47 indicate that the second portion 44 of the DBR structure will reflect blue light well.

FIG. 8 is a chart of the reflectivity 49 versus wavelength for a normal incident angle for the overall reflector structure 34. The chart compares the reflectivity spectrum of the prior art reflector to that of the novel reflector. There are two distinct stop-band features for the novel reflector indicating the complexity of the reflector design. Dashed curve 50 is the reflectivity versus wavelength curve 50 of FIG. 3 that is reproduced in FIG. 8 for comparison purposes.

Figure 9:
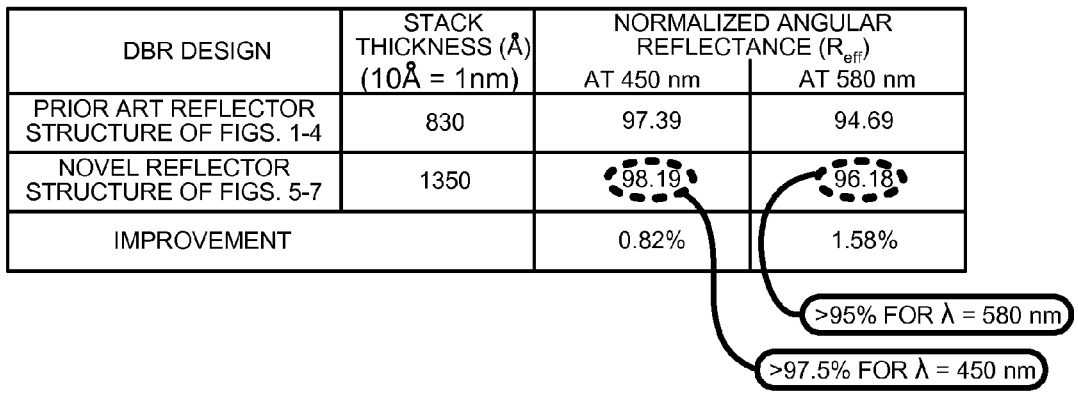
FIG. 9 is a table that compares the normalized angular reflectance at 450 nm and at 580 nm of the novel reflector structure of FIGS. 5-7 to the prior art reflector structure of FIGS. 1-4.

FIG. 9 is a table that sets forth the comparison. For first light having a wavelength of 580 nm (generally referred to herein as yellow light) passing from the substrate and into the reflector structure, the novel reflector structure 34 of FIGS. 5-7 has a reflectivity greater than 95.0 percent. For second light having a wavelength of 450 nm (generally referred to herein as blue light) passing from the substrate and into the reflector structure, the novel reflector structure 34 of FIGS. 5-7 has a reflectivity greater than 97.5 percent.

Referring to white LED assembly 20 of FIG. 5, the phosphors absorb the blue light emitted from the LED device 21 and down-convert it to longer wavelength (500 nm-700 nm) light. The long wavelength light re-emitted isotropically from the phosphor particles and some portion of long wavelength light will inevitably return to the LED surface. The probability of the returned light to escape the LED device 21 is referred as the Photon Recycling Efficiency (PRE). The unabsorbed blue light emitted from the LED device may also be back-scattered by the phosphors and return to the LED device. A comprehensive ray-tracing model was employed to estimate the PRE for various wavelengths light. The absorption of the Indium Tin Oxide (ITO), the metal electrode, GaN material loss, the scattering structure and the reflector were all included in the simulation.

Figure 10:
FIG. 10 is a table that compares measured PRE values of the novel reflector structure of FIGS. 5-7 (at 450 nm, 580 nm, and 630 nm) with calculated PRE values to the prior art reflector structure of FIGS. 1-4 (at 450 nm, 580 nm, and 630 nm).

The simulation was performed using 450 nm light, 580 nm light, and 630 nm light. The percentage of light reflected (or "PRE") is set forth in the table of FIG. 10. The relatively small differences in reflectivity between the novel reflector structure and the conventional reflector structure indicated in the table of FIG. 9 are amplified in the real device due to light within the LED device often making multiple bounces within the device. Simulation indicates that switching from the conventional reflector structure 6 of FIG. 1 to the novel reflector structure 34 of FIG. 5 results in more than a 5.0 percent improvement in Photon Recycling Efficiency for both 580 nm light and 630 nm light.

Figure 11:
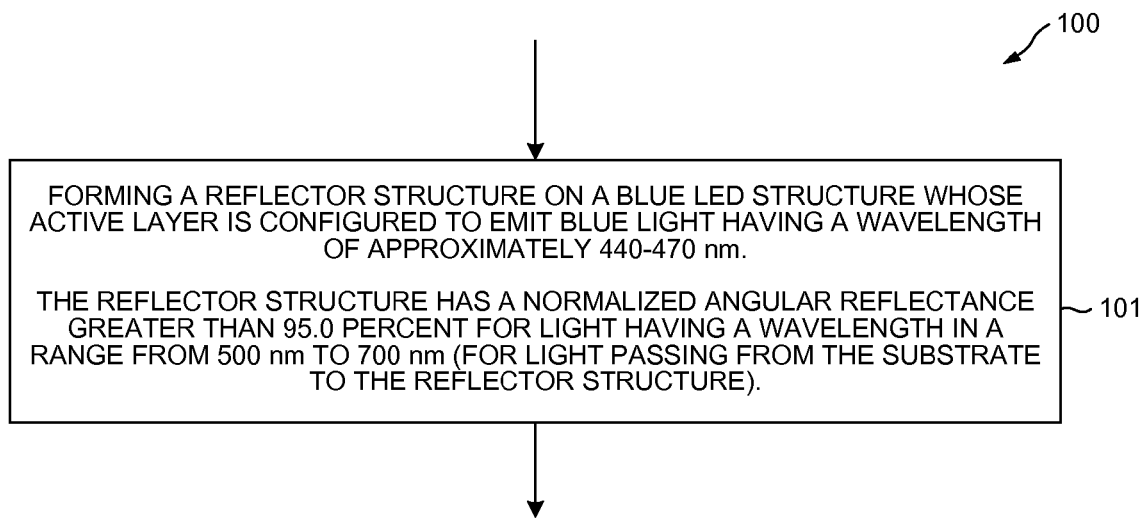
FIG. 11 is a flowchart of a method for forming a reflector structure on a blue LED that exhibits a high normalized angular reflectance for light having a wavelength in a range from 500 nm to 700 nm and in another range from 440 nm to 470 nm.

FIG. 11 is a flowchart of a method 100 in accordance with one novel aspect. A reflector structure is formed (step 101) on the backside of a substrate of a blue LED device. The active layer of the blue LED device is configured to emit light having a wavelength of approximately 440-470 nm, whereas the reflector structure has a normalized angular reflectance greater than 95.0% for light having a wavelength in a range from 500 nm to 700 nm. In one specific example, the reflector structure also has a normalized angular reflectance greater than 97.5% for light having a wavelength of 440-470 nm. In one specific example, the reflector structure formed in step 101 is the reflector structure 34 of FIGS. 5 and 6, where this reflector structure 34 has a TIR layer, a DBR structure, and an underlying layer of metal of the thicknesses and constituent materials set forth in FIG. 7.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A Light Emitting Diode (LED) device comprising:
a substrate; and
a reflector structure disposed below the substrate, the reflector structure comprising:
a low-index total internal reflection layer (TIR) disposed below the substrate;
a Distributed Bragg Reflector (DBR) disposed below the TIR; and
a reflective metal layer disposed below the DBR,
wherein the DBR comprises a first plurality of periods and a second plurality of periods, wherein each of the first plurality of periods includes a first layer of a high index dielectric material with a first thickness and a second layer of silicon dioxide with a second thickness, and wherein each of the second plurality of periods includes a first layer of the high index dielectric material with a third thickness and a second layer of silicon dioxide with a fourth thickness,
wherein the TIR is a single layer of silicon dioxide that is thicker than any silicon dioxide layer of the DBR.

2. The LED device of claim 1, wherein the high index dielectric material is selected from the group consisting of: TiO2, ZnSe, Si3N4, Nb2O5 and Ta2O5.

3. The LED device of claim 1, wherein the reflector structure has a reflectance greater than 90 percent for first light passing from the substrate to the reflector structure, and wherein the first light has a wavelength in a first range from 500 nm to 700 nm.

4. The LED device of claim 3, wherein the reflector structure has a reflectance greater than 90 percent for second light passing from the substrate to the reflector structure, and wherein the second light has a wavelength in a second range from 440 nm to 470 nm.

5. The LED device of claim 1, wherein the first layer of each of the first plurality of periods is titanium dioxide approximately 75 nm thick, wherein the second layer of each of the first plurality of periods is silicon dioxide approximately 138 nm thick, wherein the first layer of each of the second plurality of periods is titanium dioxide approximately 46 nm thick, and wherein the second layer of each of the second plurality of periods is silicon dioxide approximately 85 nm thick.

6. The LED device of claim 5, wherein a titanium dioxide layer of the first plurality of periods of the DBR is in contact with the TIR.

7. The LED device of claim 5, wherein a titanium dioxide layer of the second plurality of periods of the DBR is in contact with a silicon dioxide layer of the first plurality of periods.

8. The LED device of claim 1, wherein the reflective metal layer is made of a metal taken from the group consisting of: aluminum, silver, rhodium, platinum and nickel.

9. The LED device of claim 1, wherein the substrate is a transparent substrate.

10. The LED device of claim 1,
wherein the second thickness is greater than the first thickness, and wherein the fourth thickness is greater than the third thickness.

11. The LED device of claim 10, wherein the first high index dielectric material is selected from the group consisting of: TiO2, ZnSe, Si3N4, Nb2O5 and Ta2O5; and wherein the second high index dielectric material is selected from the group consisting of: TiO2, ZnSe, Si3N4, Nb2O5 and Ta2O5.

12. The LED device of claim 1, further comprising an active layer configured to emit a first light of a wavelength less than 500 nm, wherein the reflector structure has a reflectance greater than 90.0 percent for a second light passing from the substrate and to the reflector structure, and wherein the second light has a wavelength in a range from 500 nm to 700 nm.

13. The LED device of claim 1, further comprising an active layer comprising indium and gallium and configured to emit light of a wavelength less than 500 nm, wherein an overall LED device exhibits a Photon Recycling Efficiency (PRE) of more than 85 percent for light having a wavelength in a range of 500-700 nm.

14. The LED device of claim 1, further comprising an active layer configured to emit a first light of a wavelength of approximately 440-470 nm, wherein the reflector structure has a reflectance greater than 90.0 percent for a second light passing from the substrate to the reflector structure, and wherein the second light has a wavelength of approximately 500-700 nm.

* * * * *